(12) United States Patent
Ju et al.

(10) Patent No.: US 11,864,318 B2
(45) Date of Patent: Jan. 2, 2024

(54) ELECTRONIC DEVICE INCLUDING MULTIPLE PRINTED CIRCUIT BOARDS

(71) Applicant: Samsung Electronics Co., Ltd., Suwon-si (KR)

(72) Inventors: Wanjae Ju, Suwon-si (KR); Jaehan Kim, Suwon-si (KR); Seunghak Lee, Suwon-si (KR); Jungyong Yun, Suwon-si (KR); Sungchel Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/161,272

(22) Filed: Jan. 30, 2023

(65) Prior Publication Data
US 2023/0180387 A1 Jun. 8, 2023

Related U.S. Application Data

(63) Continuation of application No. 17/314,358, filed on May 7, 2021, now Pat. No. 11,570,895.

(30) Foreign Application Priority Data

Jun. 2, 2020 (KR) .................. 10-2020-0066607

(51) Int. Cl.
*H05K 1/18* (2006.01)
*H05K 1/14* (2006.01)
(Continued)

(52) U.S. Cl.
CPC ............ *H05K 1/14* (2013.01); *H01M 50/284* (2021.01); *H05K 1/0201* (2013.01); *H05K 1/0218* (2013.01)

(58) Field of Classification Search
CPC .................. H05K 1/14; H05K 1/0218
(Continued)

(56) References Cited

U.S. PATENT DOCUMENTS

2007/0123295 A1 5/2007 Kim et al.
2014/0225806 A1 8/2014 Lee et al.
(Continued)

FOREIGN PATENT DOCUMENTS

CN 109831551 A 5/2019
JP 2012-060041 A 3/2012
(Continued)

OTHER PUBLICATIONS

International Search Report dated Aug. 17, 2021, issued in International Application No. PCT/KR2021/005782.
(Continued)

*Primary Examiner* — Binh B Tran
(74) *Attorney, Agent, or Firm* — Jefferson IP Law, LLP

(57) ABSTRACT

An electronic device is provided. The electronic device includes a first printed circuit board having a first surface and a second surface, a second printed circuit board having a first surface and a second surface disposed to be spaced apart from the first printed circuit board, a battery disposed between the first printed circuit board and the second printed circuit board, a first connection member to electrically connect the first printed circuit board and the second printed circuit board, and a second connection member to electrically connect the first printed circuit board and the second printed circuit board, wherein the first connection member and the second connection member may be arranged to at least partially overlap at a portion passing by the battery.

20 Claims, 18 Drawing Sheets

(51) Int. Cl.
H01M 50/284 (2021.01)
H05K 1/02 (2006.01)

(58) Field of Classification Search
USPC ............................................... 361/749
See application file for complete search history.

(56) References Cited

U.S. PATENT DOCUMENTS

| | | | |
|---|---|---|---|
| 2016/0198560 A1 | 7/2016 | Shin et al. | |
| 2017/0317490 A1* | 11/2017 | Penny | H02J 7/0042 |
| 2018/0145435 A1* | 5/2018 | Peralta | H05K 1/147 |
| 2018/0324964 A1 | 11/2018 | Yoo et al. | |
| 2019/0344858 A1* | 11/2019 | Wakeham | B62M 6/40 |
| 2019/0386380 A1 | 12/2019 | Ham et al. | |
| 2020/0093012 A1 | 3/2020 | Woo et al. | |
| 2021/0084764 A1 | 3/2021 | Yang et al. | |
| 2022/0110212 A1 | 4/2022 | Kim et al. | |
| 2022/0155826 A1 | 5/2022 | An et al. | |
| 2022/0159112 A1 | 5/2022 | Kim et al. | |

FOREIGN PATENT DOCUMENTS

| | | |
|---|---|---|
| KR | 10-2006-0059062 A | 6/2006 |
| KR | 10-1024914 B1 | 3/2011 |
| KR | 10-1305518 B1 | 9/2013 |
| KR | 10-2015-0063820 A | 6/2015 |
| KR | 10-2019-0087216 A | 7/2019 |
| KR | 10-2019-0141474 A | 12/2019 |
| KR | 10-2020-0101153 A | 8/2020 |
| KR | 10-2020-0106460 A | 9/2020 |
| KR | 10-2021-0017097 A | 2/2021 |

OTHER PUBLICATIONS

European Search Report dated May 22, 2023, issued in European Application No. 21818197.2.

* cited by examiner

US 11,864,318 B2

ELECTRONIC DEVICE INCLUDING MULTIPLE PRINTED CIRCUIT BOARDS

CROSS-REFERENCE TO RELATED APPLICATION(S)

This application is a continuation application of prior application Ser. No. 17/314,358, filed on May 7, 2021, which is based on and claims priority under 35 U.S.C. § 119(a) of a Korean patent application number 10-2020-0066607, filed on Jun. 2, 2020, in the Korean Intellectual Property Office, the disclosure of which is incorporated by reference herein in its entirety.

BACKGROUND

1. Field

The disclosure relates to an electronic device including a plurality of printed circuit boards.

2. Description of Related Art

Various electronic components constituting an electronic device are generally arranged on or connected to a printed circuit board (PCB).

To configure an electronic device that can perform various functions, more types of electronic components are included in the electronic device. In addition, to increase the usage hours of a mobile electronic device, it is necessary to mount a large-capacity battery.

In this situation, the area of a printed circuit board that can be installed in the limited internal space of an electronic device is gradually decreasing. Because of this reason, manufacturers are using a plurality of printed circuit boards placed at different locations.

The above information is presented as background information only to assist with an understanding of the disclosure. No determination has been made, and no assertion is made, as to whether any of the above might be applicable as prior art with regard to the disclosure.

SUMMARY

A plurality of printed circuit boards may be electrically connected through a connection element such as a flexible printed circuit board. As more and more types of electronic components are disposed on or connected to the printed circuit boards, the number of connection terminals is increasing. To include more terminals, the size of a connector such as a receptacle or a socket disposed on the printed circuit boards is also increasing.

An increase in size of the connector may reduce the design efficiency of the printed circuit board. To remove a connector from a printed circuit board, there is an attempt to configure a printed circuit board and a connection member as a single body. In the case of integrally configuring a printed circuit board and a connection member, the connector can be removed, but it may be disadvantageous in cost and the ease of repair may deteriorate.

Aspects of the disclosure are to address at least the above-mentioned problems and/or disadvantages and to provide at least the advantages described below. Accordingly, an aspect of the disclosure is to provide an electronic device including a plurality of printed circuit boards capable of solving the above problems.

Additional aspects will be set forth in part in the description which follows and, in part, will be apparent from the description, or may be learned by practice of the presented embodiments.

In accordance with an aspect of the disclosure, the electronic device is provided. The electronic device includes a first printed circuit board having a first surface and a second surface opposite to the first surface, a second printed circuit board having a first surface and a second surface opposite to the first surface and disposed to be spaced apart from the first printed circuit board, a battery disposed between the first printed circuit board and the second printed circuit board, a first connection member that is connected to the first surface of the first printed circuit board and is connected to one of the first surface and the second surface of the second printed circuit board to thereby electrically connect the first printed circuit board and the second printed circuit board, and a second connection member that is connected to the second surface of the first printed circuit board and is connected to one of the first surface and the second surface of the second printed circuit board to thereby electrically connect the first printed circuit board and the second printed circuit board, wherein the first connection member and the second connection member may be arranged to at least partially overlap at a portion passing by the battery.

In accordance with another aspect of the disclosure, an electronic device is provided. The electronic device includes a first printed circuit board having a first surface and a second surface opposite to the first surface, a second printed circuit board having a first surface and a second surface opposite to the first surface and disposed to be spaced apart from the first printed circuit board, a battery having a first surface and a second surface opposite to the first surface and disposed between the first printed circuit board and the second printed circuit board, a first connection member that is connected to the first surface of the first printed circuit board and is connected to one of the first surface and the second surface of the second printed circuit board to thereby electrically connect the first printed circuit board and the second printed circuit board, and a second connection member that is connected to the second surface of the first printed circuit board and is connected to one of the first surface and the second surface of the second printed circuit board to thereby electrically connect the first printed circuit board and the second printed circuit board, wherein the first connection member may pass by the first surface of the battery and the second connection member may pass by the second surface of the battery.

In accordance with another aspect of the disclosure, an electronic device is provided. The electronic device includes a plurality of printed circuit boards. According to aspects of the present disclosure, it is possible to secure a component arrangement area of the printed circuit boards.

In addition, compared to the case where a printed circuit board and a connection member are integrally configured, there are advantages of cost reduction and of being easy to repair.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
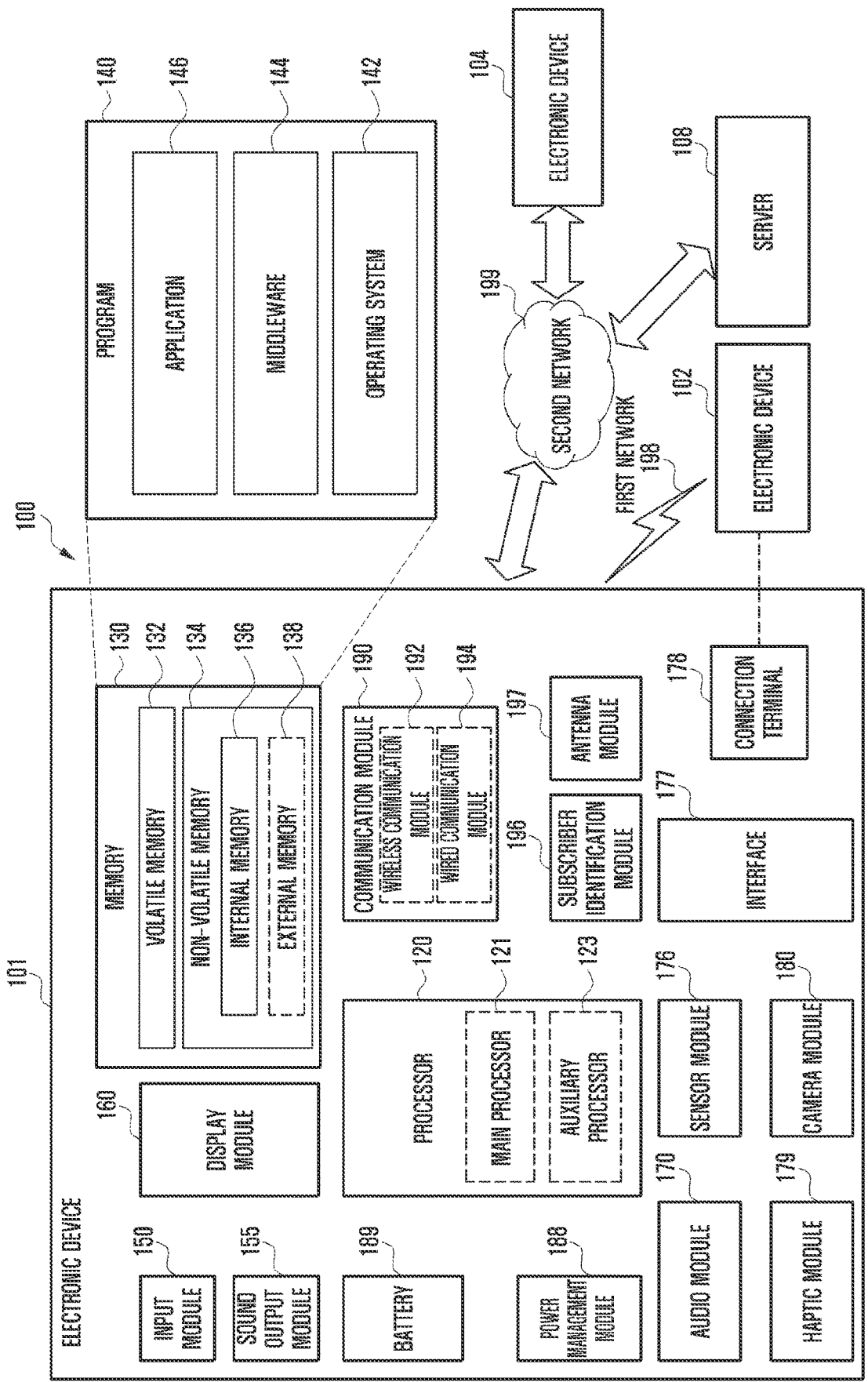
FIG. 1 is a block diagram of an electronic device in a network environment according to an embodiment of the disclosure.

The following description with reference to the accompanying drawings is provided to assist in a comprehensive understanding of various embodiments of the disclosure as defined by the claims and their equivalents. It includes various specific details to assist in that understanding, but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but are merely used by the inventor to enable a clear and consistent understanding of the disclosure. Accordingly, it should be apparent to those skilled in the art that the following description of various embodiments of the disclosure is provided for illustration purposes only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory may include internal memory 136 and external memory 138.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2A:
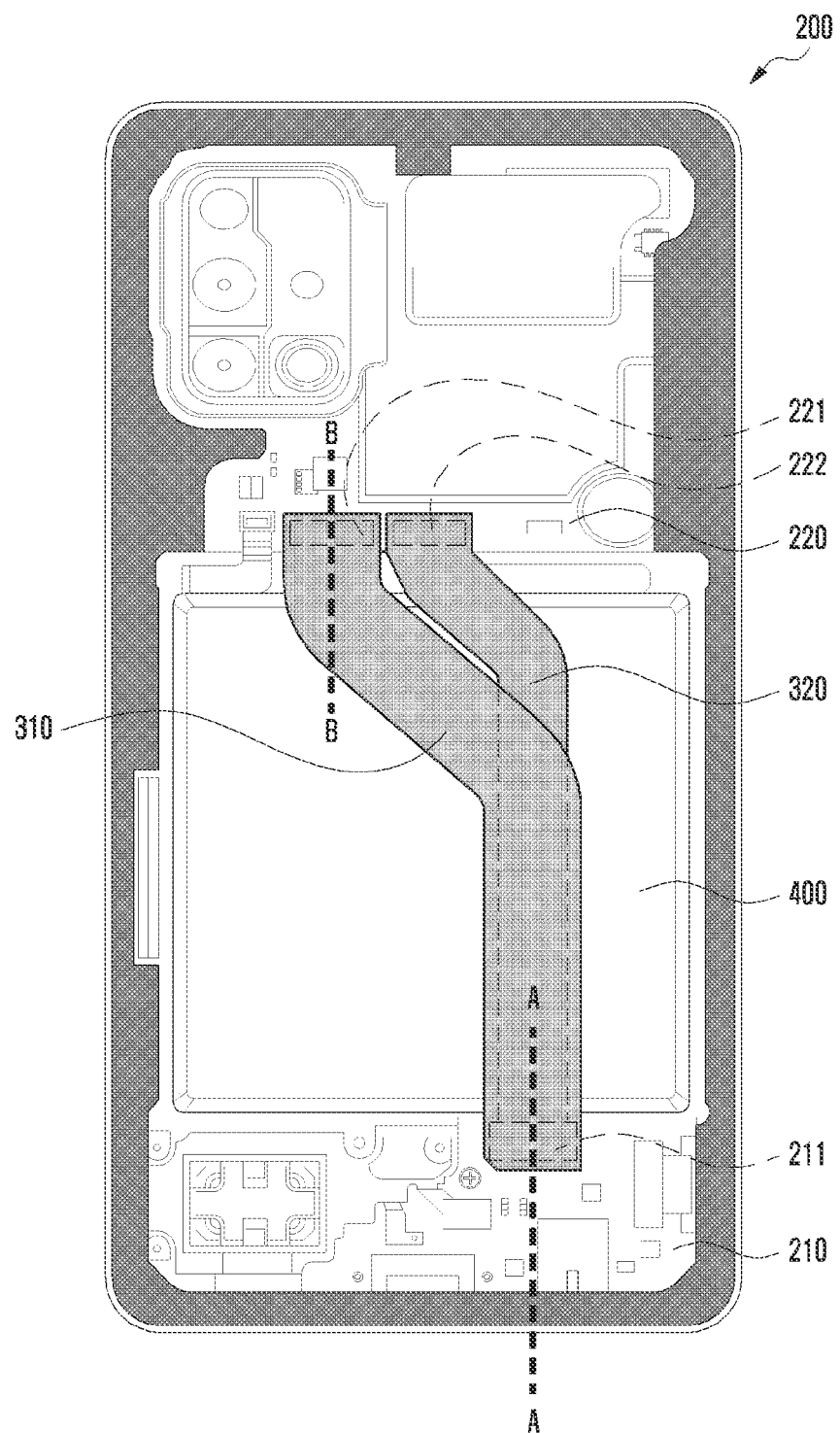
FIGS. 2A and 2B are rear views of an electronic device according to various embodiments of the disclosure.
Figure 2B:
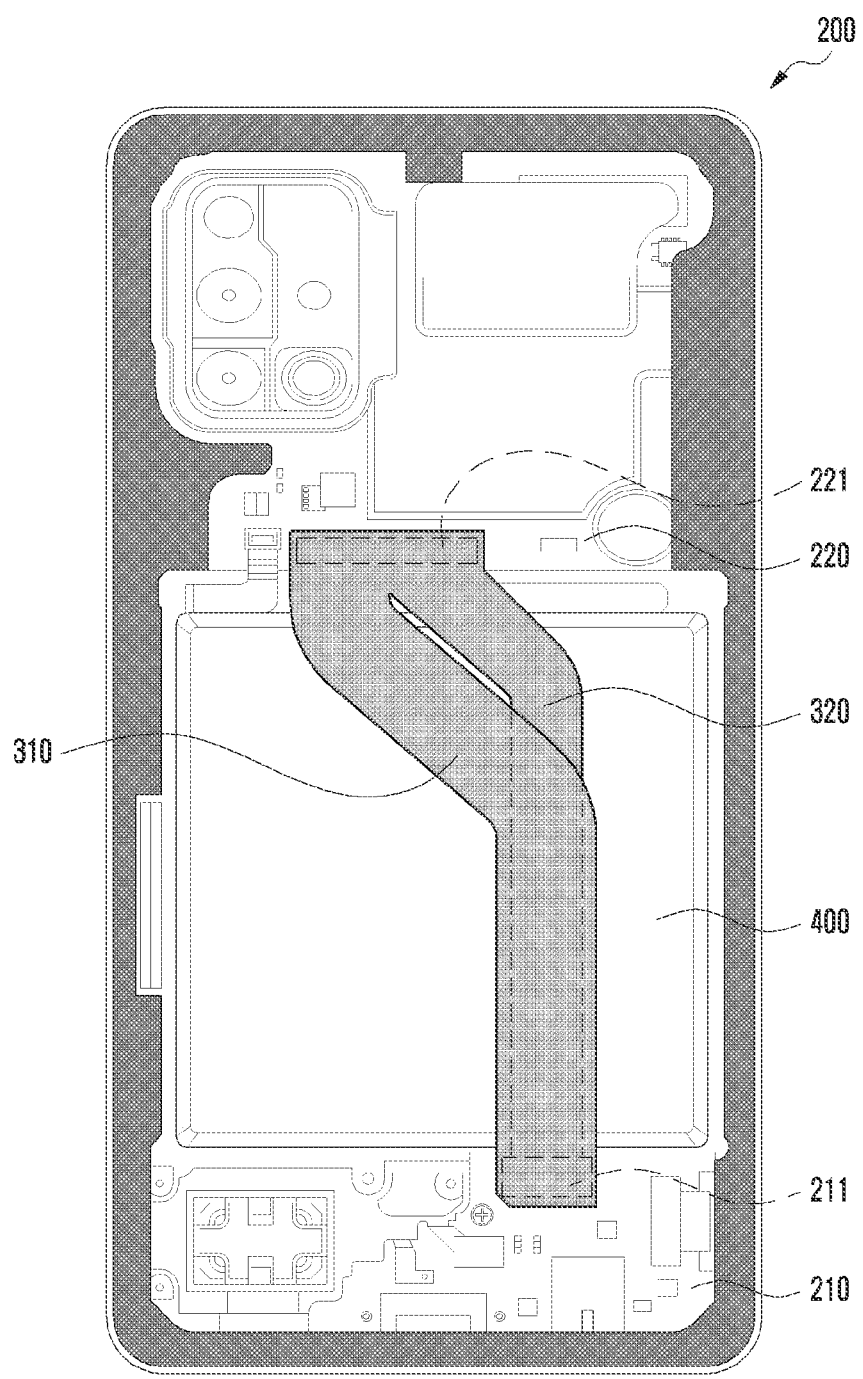

FIGS. 2A and 2B are rear views of an electronic device according to various embodiments of the disclosure.

Referring to FIGS. 2A and 2B, the electronic device 200 (e.g., electronic device 101 in FIG. 1) shown in FIG. 2A or 2B may include various electronic components illustrated in FIG. 1. For example, the electronic device 200 may include a processor 120, a memory 130, an input module 150, a sound output module 155, a display module 160, an audio module 170, a sensor module 176, an interface 177, a connection terminal 178, a power management module 188, a battery 189, a communication module 190, and/or an antenna module 197 as shown in FIG. 1. These various electronic components may be mounted on or connected to a printed circuit board (PCB) included in the electronic device.

Referring to FIG. 2A, the electronic device 200 may include a plurality of printed circuit boards to efficiently utilize a limited space. The printed circuit board disposed at the lower end of the electronic device 200 may be referred to as a first printed circuit board 210, and the printed circuit board disposed at the upper end of the electronic device 200 may be referred to as a second printed circuit board 220.

An interface for connection with an external electronic device may be disposed at the lower end of the electronic device 200. On the first printed circuit board 210 disposed at the lower end of the electronic device 200, various electronic components that perform such an interface function may be arranged. In addition, electronic components and/or a sensor module (e.g., fingerprint sensor) for processing signals of a lower end speaker and an earphone jack may be disposed. Electronic components such as a processor and a memory may be disposed on the second printed circuit board 220. Additionally, the arrangement position of electronic components may be variously changed.

The battery 400 of the electronic device 200 may be disposed between the first printed circuit board 210 and the second printed circuit board 220. The battery 400 may be electrically connected to the first printed circuit board 210 and the second printed circuit board 220 and may supply power to electronic components disposed on or connected to the first printed circuit board 210 and the second printed circuit board 220.

The first printed circuit board 210 and the second printed circuit board 220 may be electrically connected for electrical connection between electronic components disposed on and connected to the first printed circuit board 210 and electronic components disposed on and connected to the second printed circuit board 220. The first printed circuit board 210 and the second printed circuit board 220 may be electrically connected through a connection member. The connection member may be, for example, a flexible printed circuit board (FPCB) on which plural signal lines are printed.

The first printed circuit board 210 and the second printed circuit board 220 may be connected through plural connection members. For example, the first printed circuit board 210 and the second printed circuit board 220 may be electrically connected through a first connection member 310 and a second connection member 320.

The first connection member 310 and the second connection member 320 may electrically connect the first printed circuit board 210 and the second printed circuit board 220 across the battery 400 disposed between the first printed circuit board 210 and the second printed circuit board 220. With reference to FIG. 2A, the first connection member 310 and the second connection member 320 may extend across one surface of the battery 400. The first connection member 310 and the second connection member 320 may at least partially overlap at a portion passing by the battery 400.

The first connection member 310 and the second connection member 320 may be connected to a connector disposed on a first surface (e.g., first surface 220A in FIG. 3B) of the second printed circuit board 220. On the first surface of the second printed circuit board 220, one connector (e.g., second connector 221 in FIG. 2B) or plural connectors (e.g., second connector 221 and fourth connector 222 in FIG. 2B) may be disposed. When the connector disposed on the first surface of the second printed circuit board 220 is divided into a second connector 221 and a fourth connector 222 as shown in FIG. 2A, the first connection member 310 may be connected to the second connector 221, and the second connection member 320 may be connected to the fourth connector 222. When the connector disposed on the first surface of the second printed circuit board 220 is the second connector 221 as shown in FIG. 2B, the first connection member 310 and the second connection member 320 may both be connected to the second connector 221.

A connector may collectively refer to a configuration for electrically connecting at least two components. Connectors can be divided into female connectors and male connectors. A male connector may be inserted into a corresponding female connector. Accordingly, a male connector may be formed to be fitted into a female connector, and the female connector may be formed to accommodate the male connector. The insertion coupling between a male connector and a female connector may be achieved in various ways. For example, the male connector and the female connector may be insertion-coupled in a clip-like manner. When a male connector is inserted into a female connector, plural terminals included in the male connector and plural terminals included in the female connector may contact one another to make an electrical connection. A male connector may be referred to as a term such as a plug or a head, and a female connector may be referred to as a term such as a receptacle or a socket. Connectors used in the following description may include a male connector and a female connector. For example, that a connection member is connected to the connector disposed on the printed circuit board may mean that a male connector (female connector) of the connection member is insertion-coupled to the female connector (male connector) disposed on the printed circuit board. In the drawings of the specification, the connector disposed on the printed circuit board is shown as a female connector, but it is also possible to dispose a male connector on the printed circuit board and to employ a female connector as the connector of the connection member.

Figure 3A:
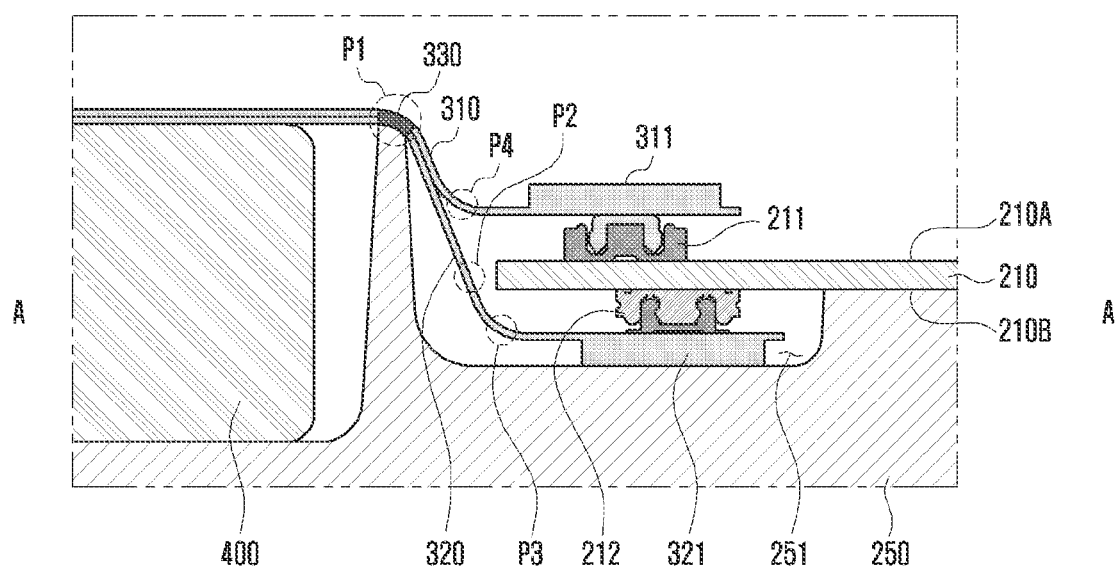
FIG. 3A is a cross-sectional view of the electronic device taken along line A-A in FIG. 2A according to an embodiment of the disclosure.
Figure 3B:
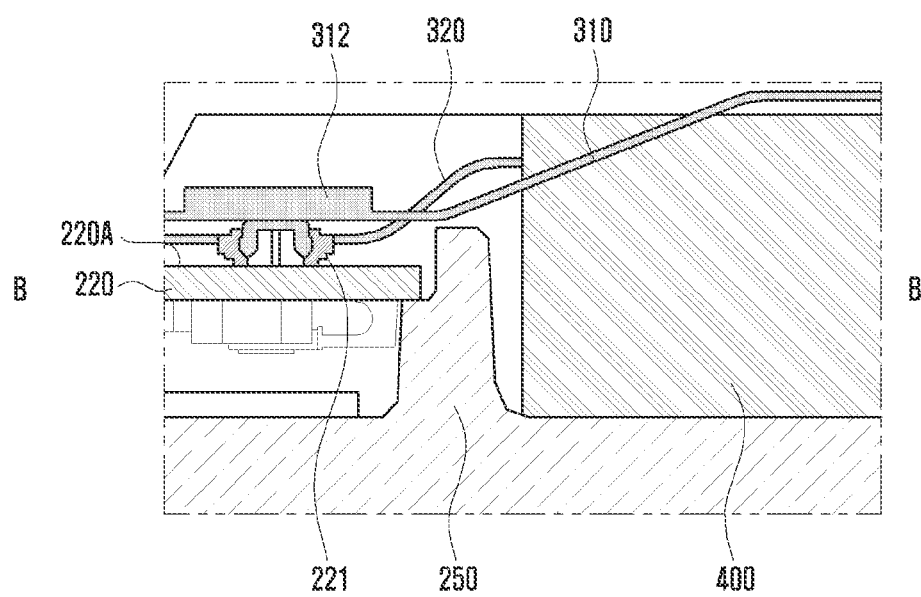
FIG. 3B is a cross-sectional view of the electronic device taken along line B-B in FIG. 2A according to an embodiment of the disclosure.

FIG. 3A is a cross-sectional view of the electronic device taken along line A-A in FIG. 2A, and FIG. 3B is a cross-sectional view of the electronic device taken along line B-B in FIG. 2A according to various embodiments of the disclosure.

Referring to FIGS. 3A and 3B, the first printed circuit board 210, the second printed circuit board 220, and the battery 400 may be disposed on a plate 250.

According to various embodiments, as shown in FIG. 3A, a seating portion 251 may be formed in at least a region of the plate 250 facing the second surface 210B of the first printed circuit board 210. The seating portion 251 may be a portion formed concavely in the plate 250. The seating part 251 may provide a space for connecting the third connector 212 disposed on the second surface 210B of the first printed circuit board 210 and the second connection member 320.

Referring to FIG. 3A, the first connection member 310 may be connected to the first surface 210A of the first printed circuit board 210, and the second connection member 320 may be connected to the second surface 210B of the first printed circuit board 210. The second surface 210B of the first printed circuit board 210 may be a surface opposite to the first surface 210A. The first connector 211 may be disposed on the first surface 210A of the first printed circuit board 210, and the third connector 212 may be disposed on the second surface 210B. Because the connector 311 installed at one end of the first connection member 310 is connected to the first connector 211 disposed on the first surface 210A of the first printed circuit board 210, the first connection member 310 may be electrically connected to the first printed circuit board 210. Because the connector 321 installed at one end of the second connection member 320 is connected to the third connector 212 disposed on the second surface 210B of the first printed circuit board 210, the second connection member 320 may be electrically connected to the first printed circuit board 210.

When the connection member and the printed circuit board are not integrally configured, the printed circuit board may require a structure (e.g., connector) for connection with the connection member. As the number of components disposed on or connected to the printed circuit board increases, the number of terminals included in the connector may increase. This may require a connector with a large width. As the physical size of a printed circuit board is limited, the arrangement of a connector having a large width may be restricted. On the other hand, when the printed circuit board and the connection member are integrally configured, there is a possibility that the manufacturing cost may increase excessively. According to various embodiments of the disclosure, the above-described problems can be solved by disposing connectors on both surfaces of the printed circuit board. By distributing connector terminals for electrically connecting electronic components arranged on or connected to the printed circuit board to the connectors disposed on both surfaces, the problem of excessive increase in the connector width can be resolved. At the same time, by arranging connectors on both surfaces of the printed circuit board, it is possible to efficiently secure an arrangement area of the printed circuit board.

In some cases, it may be possible to consider the frequency band or type of the signal transmitted through the connection member. The type of the signal may include, for example, a high-frequency signal, a power signal, a control signal, and/or a data signal. For example, the terminals included in the first connector 211 to be connected to the first connection member 310 may be electrically connected to electronic components that transmit and receive signals of similar frequency bands or similar types. The first connection member 310 connected to the first connector 211 may transmit signals of similar frequency bands or similar types. In addition, the terminals included in the third connector 212 to be connected to the second connection member 320 may be electrically connected to electronic components that transmit and receive signals of similar frequency bands or similar types. The second connection member 320 connected to the third connector 212 may transmit signals of similar frequency bands or similar types. In this way, when the frequency or type of signals is considered, it is possible to solve an interference problem caused by a difference in frequency band or type of signals.

The connection member that transmits signals that may cause abnormal operation on various signals transmitted to external electronic devices (e.g., signal for recognizing a wireless charger, information signal of short-range communication such as near field communication (NFC)) may be placed inside the electronic device 200. For example, such signals may be transmitted through the second connection member 320 disposed further inside the electronic device 200 compared to the first connection member 310.

Referring to FIG. 3A, a reinforcing tape 330 may be attached to a portion where the first connection member 310 and the second connection member 320 are bent (e.g., portion P3 or P4 in FIG. 3A) or a portion that is affected or likely to be affected by interference caused by other structural objects (e.g., portion P1 or P2 in FIG. 3A). The first connection member 310 and the second connection member 320 connecting the first printed circuit board 210 and the second printed circuit board 220 may interfere with the plate 250 or the first printed circuit board 210 disposed close to the connection member, and may be bent by a difference due to the shape of the plate 250 and/or a height difference between various components arranged on the plate 250. At such a portion, there is a risk of damage to the first connection member 310 and the second connection member 320. By attaching the reinforcing tape 330 to a portion where the first connection member 310 and the second connection member 320 interfere with other structural objects and/or are bent, it is possible to prevent damage to the first connection member 310 and the second connection member 320. For example, the reinforcing tape 330 may be attached to at least one of portions P1, P2, P3 and P4 shown in FIG. 3A. In some cases, the portion where the first connection member 310 and the second connection member 320 interfere with other structural objects and/or is to be bent may be formed to have a thicker thickness than other portions.

Referring to FIG. 3B, the first connection member 310 and the second connection member 320 may be connected to the first surface 220A of the second printed circuit board 220. A second connector 221 may be disposed on the first surface 220A of the second printed circuit board 220. Because the connector 312 installed at the other end of the first connection member 310 is connected to the second connector 221 disposed on the first surface 220A of the second printed circuit board 220, the first connection member 310 may be electrically connected to the second printed circuit board 220. Because the connector (not shown) installed at the other end of the second connection member 320 is connected to the second connector 221 disposed on the first surface 220A of the second printed circuit board 220, the second connection member 320 may be electrically connected to the second printed circuit board 220.

The second connector 221 and the fourth connector 222 separated from each other may be disposed on the first surface 220A of the second printed circuit board 220 (refer to FIG. 2A). In this case, the first connection member 310 may be connected to the second connector 221, and the second connection member 320 may be connected to the fourth connector 222.

Connection member bending and/or interference between the connection member and the plate 250 or the printed circuit board may also occur at a portion where the second printed circuit board 220 is connected to the first connection member 310 and the second connection member 320. As described above, the reinforcing tape 330 may be attached to a portion where such bending or interference occurs, or this portion may be formed to be thicker than other portions.

Figure 4A:
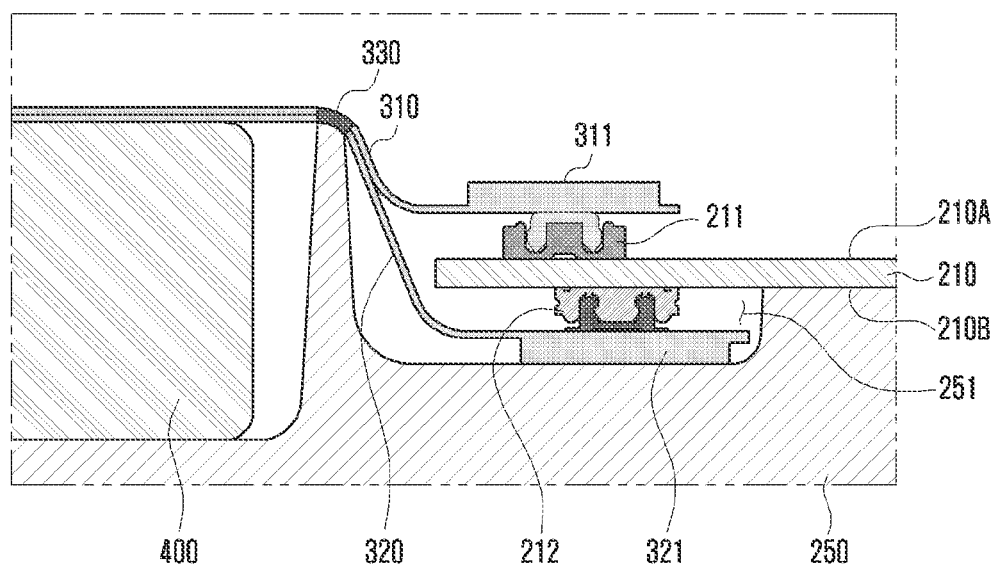
FIGS. 4A, 4B, and 4C are cross-sectional views of a first printed circuit board, a first connection member, and a second connection member according to various embodiments of the disclosure.
Figure 4B:
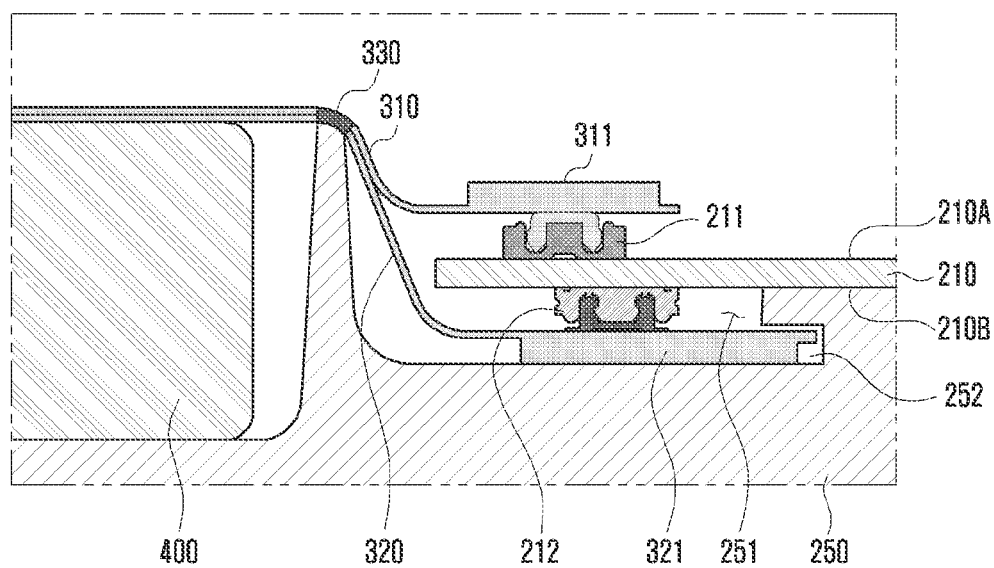
Figure 4C:
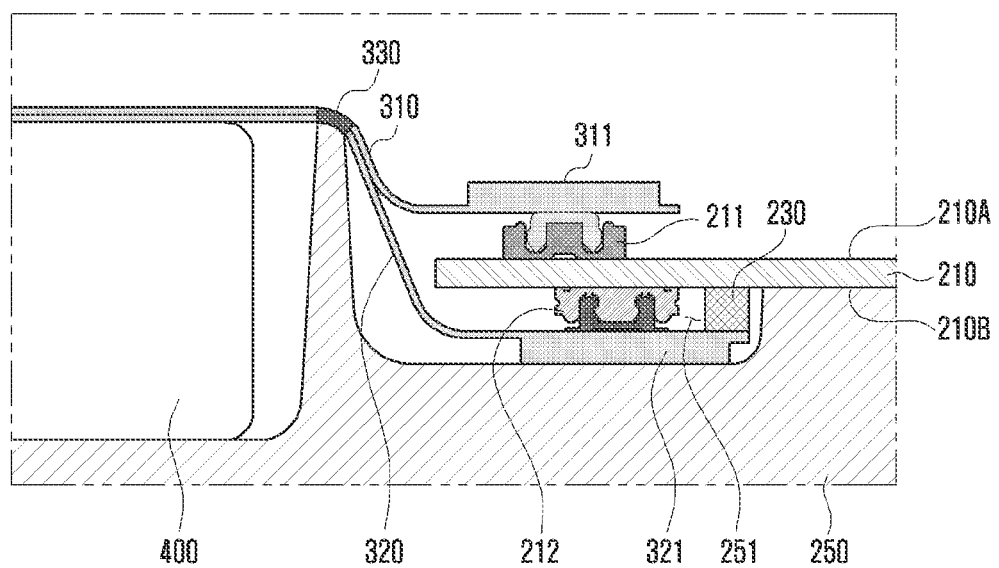

FIGS. 4A, 4B, and 4C are cross-sectional views of a first printed circuit board, a first connection member, and a second connection member according to various embodiments of the disclosure.

Referring to FIG. 4A, the connector 321 of the second connection member 320 connected to the third connector 212 disposed on the second surface 210B of the first printed circuit board 210 may be formed to extend along the extending direction of the first printed circuit board 210. When the connector 321 of the second connection member 320 is formed to extend in this way, the area in which the connector 321 of the second connection member 320 and the seating portion 251 formed in the plate 250 contact with each other may increase. Even if an external force is applied to the electronic device 200, as the movement of the connector 321 of the second connection member 320 is restricted by the seating portion 251, the second connection member 320 may be not separated from the first printed circuit board 210.

Referring to FIG. 4B, an insertion groove 252 may be formed in the seating portion 251. The insertion groove 252 may be a groove formed in the seating portion 251 at a portion close to the connector 321 of the second connection member 320. When the second connection member 320 is connected to the first printed circuit board 210, at least a portion of the connector 321 of the second connection member 320 may be inserted into the seating portion 251. When a portion of the connector 321 of the second connection member 320 is inserted into the insertion groove 252 formed in the seating portion 251, the connection between the second connection member 320 and the first printed circuit board 210 may be stably maintained. Therefore, even if an external force is applied to the electronic device 200, the second connection member 320 may be not separated from the first printed circuit board 210.

Referring to FIG. 4C, a buffer member 230 may be disposed between the connector 321 of the second connection member 320 and the second surface 210B of the first printed circuit board 210. The buffer member 230 may be made of a material having elasticity. Elastic deformation of the connector 321 of the second connection member 320 or the first printed circuit board 210 may be suppressed by the buffer member 230. This can prevent damage to the first printed circuit board 210 or the connector 321 due to frequent elastic deformation. As shown in FIG. 4C, the buffer member 230 may be disposed at a position farther from the battery 400 relative to the third connector 212. The buffer member 230 may also be disposed at a position closer to the battery 400 relative to the third connector 212. In some cases, two buffer members 230 may be arranged to face each other with the third connector 212 therebetween.

Figure 5:
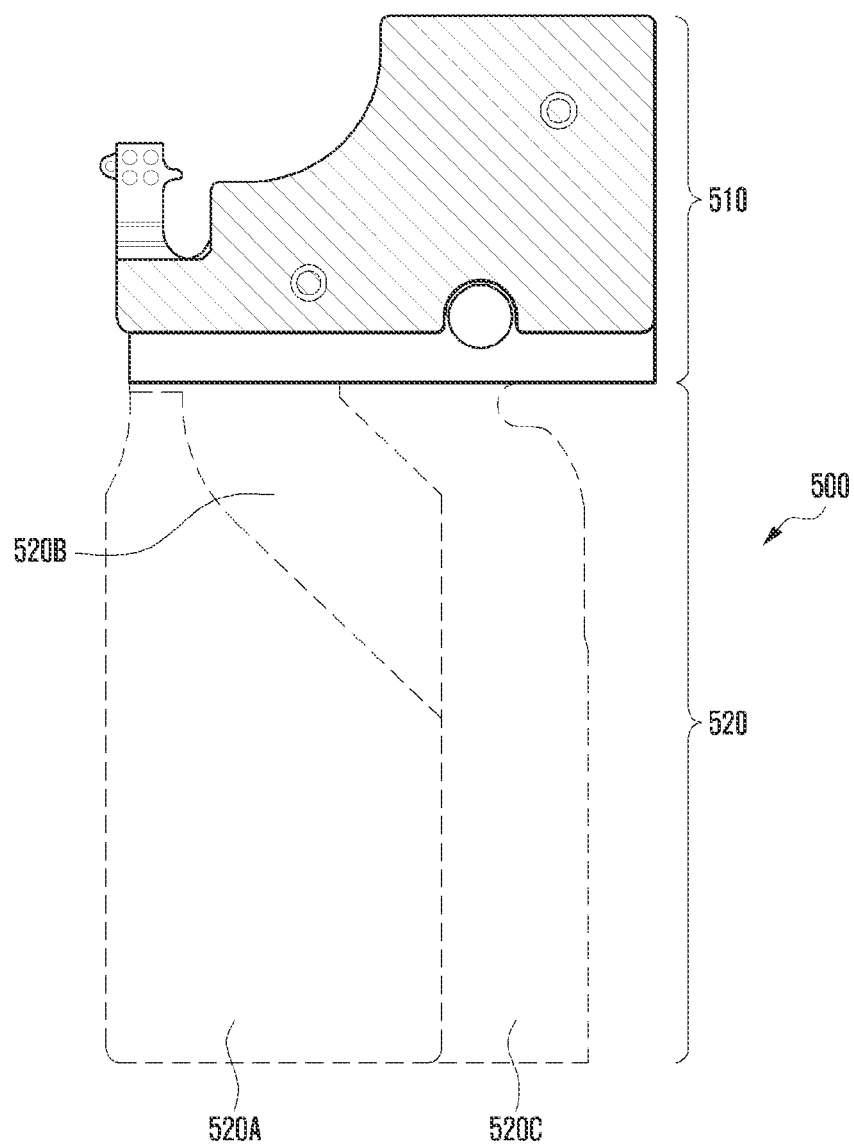
FIG. 5 is a view of a sheet member according to an embodiment of the disclosure.

FIG. 5 is a view of a sheet member according to an embodiment of the disclosure.

Referring to FIG. 5, the sheet member 500 may include at least one of a heat diffusion sheet for heat dissipation of various electronic components or a noise shielding sheet for noise shielding of various electronic components. For example, the sheet member 500 may be formed by stacking a heat diffusion sheet and a noise shielding sheet.

The sheet member 500 may include a plurality of regions. Referring to FIG. 5, the sheet member 500 may include a first region 510 and a second region 520. The first region 510 may be a region covering the second printed circuit board 220. The second region 520 may be a region covering the battery 400. Heat emitted from the electronic components disposed on the second printed circuit board 220 may diffuse to the second region 520 of the sheet member 500 through the first region 510. The heat dissipation performance of the sheet member 500 is proportional to the surface area, and the heat dissipation performance is excellent as heat spreads to the sheet member 500 having a large area. Hence, effective heat dissipation may be possible as the area of the sheet member 500 increases.

Considering an increase in the thickness of the electronic device 200, the sheet member 500 may be included only in a portion where the first connection member 310 and the second connection member 320 do not pass by. As the overlapping region between the first connection member 310 and the second connection member 320 increases, the area of the portion where the first connection member 310 and the second connection member 320 do not pass by increases, so it may be advantageous to secure the area of the sheet member 500. For example, the second region 520 of the sheet member 500 may be composed of only a region 520A excluding the portion where the first connection member 310 and the second connection member 320 pass by.

The sheet member 500 may be formed to cover up to the overlapping region between the first connection member 310 and the second connection member 320. In this case, considering the first connection member 310 and the second connection member 320, the second region 520 of the sheet member 500 may include regions having different thicknesses. For example, the region 520C corresponding to the overlapping portion between the first connection member 310 and the second connection member 320 may be thinner than the region 520B where the first connection member 310 and the second connection member 320 do not overlap or the region 520A where the first connection member 310 and the second connection member 320 do not pass by.

Figure 6A:
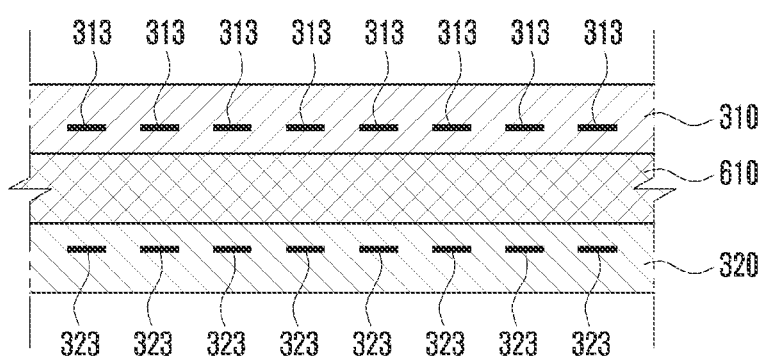
FIGS. 6A, 6B and 6C are cross-sectional views of a first connection member and a second connection member according to various embodiments of the disclosure.
Figure 6B:
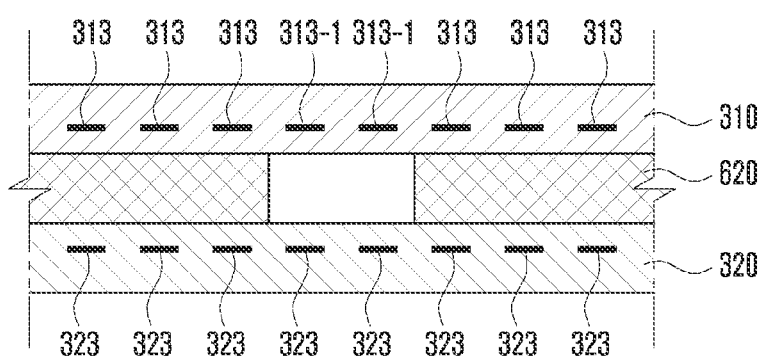
Figure 6C:
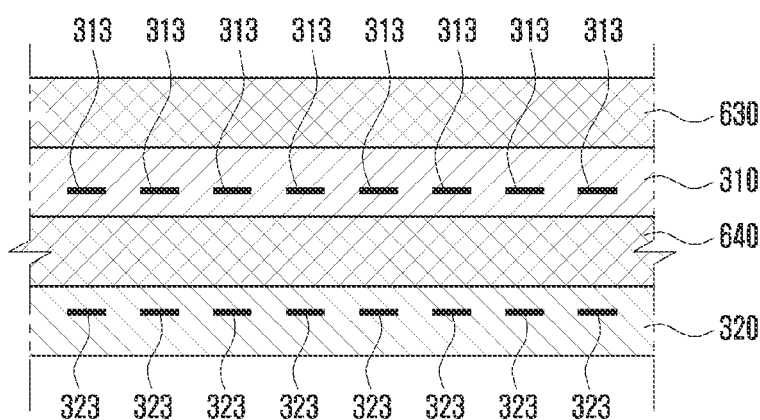

FIGS. 6A, 6B and 6C are cross-sectional views of a first connection member and a second connection member according to various embodiments of the disclosure.

Referring to FIGS. 6A, 6B, and 6C, a plurality of signal wires 313 and 323 may be included in the first connection member 310 and the second connection member 320. The position, shape, and size (width, area) of the signal wires 313 included in the first connection member 310 and the signal wires 323 included in the second connection member 320 shown in FIGS. 6A to 6C are merely a simplified illustration for ease of description, and the position, shape, and size of the signal wires 313 and 323 are not limited to those shown in FIGS. 6A to 6C.

Referring to FIG. 6A, a shielding member 610 may be disposed between the first connection member 310 and the second connection member 320 in a section where the first connection member 310 and the second connection member 320 overlap. The shielding member 610 may be made of a material capable of shielding electromagnetic interference (EMI). For example, the shielding member 610 may include a conductive layer for shielding electromagnetic interference. The shielding member 610 may be adhered to at least one of the first connection member 310 or the second connection member 320 and may be fixed between the first connection member 310 and the second connection member 320.

Referring to FIG. 6B, a shielding member 620 may be disposed only in a certain region between the first connection member 310 and the second connection member 320. Among the signals transmitted through the first connection member 310 or the second connection member 320, there may be a signal whose transmission line characteristics are negatively impacted by the shielding member 620. Such a signal may be a signal that is more affected by the shield member 620 than electromagnetic interference. The shielding member 620 may be not disposed in a portion corresponding to the signal wire (e.g., signal wire 313-1 in FIG. 6B) transmitting such a signal. The shielding member 620 may be applied in part as shown in FIG. 6B according to the transmission characteristics and impedance design structure of signals transmitted through the first connection member 310 and the second connection member 320.

Referring to FIG. 6C, a first shielding member 630 may be disposed on the upper surface of the first connection member 310 disposed relatively close to the outside in the electronic device for shielding external noise signals, and a second shielding member 640 may be disposed between the first connection member 310 and the second connection member 320.

Figure 7:
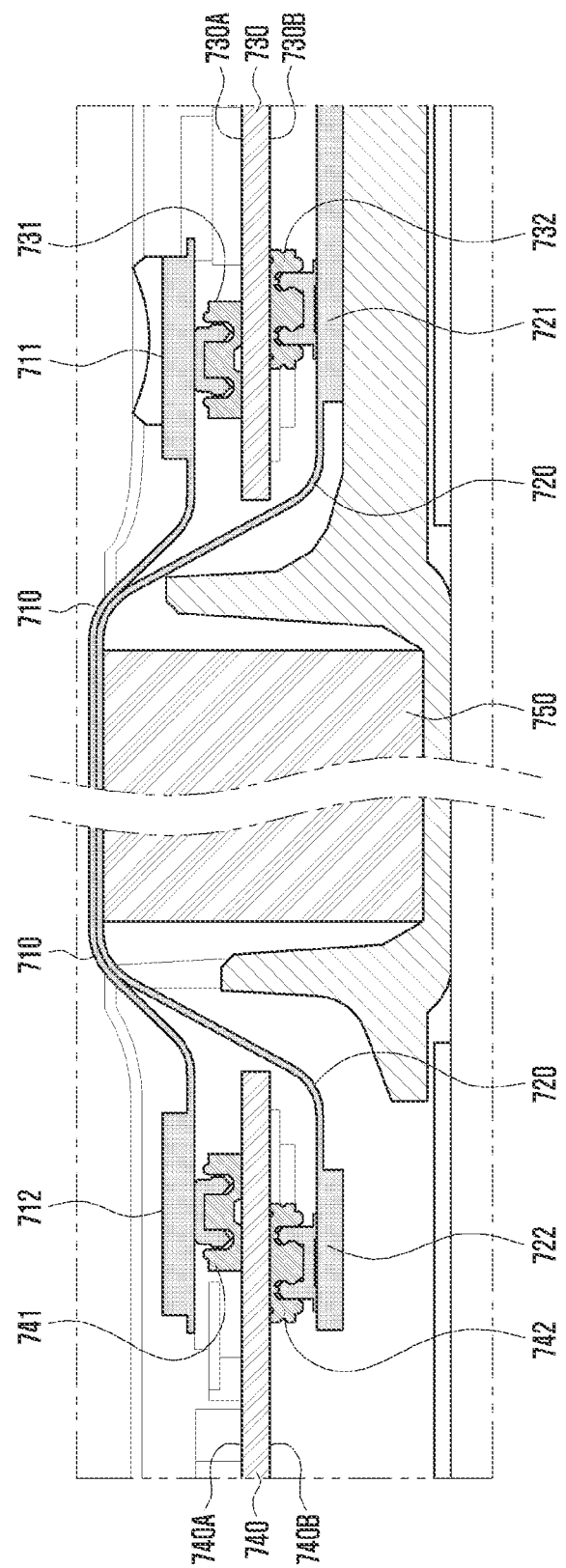
FIG. 7 is a cross-sectional view of an electronic device according to an embodiment of the disclosure.

FIG. 7 is a cross-sectional view of an electronic device according to an embodiment of the disclosure.

According to various embodiments, similarly to the first printed circuit board 730 (e.g., first printed circuit board 210 in FIG. 2A) described above, the second printed circuit board 740 (e.g., second printed circuit board 220 in FIG. 2A) may also be connected to the first connection member 710 (e.g., first connection member 310 in FIG. 2A) and the second connection member 720 (e.g., second connection member 320 in FIG. 2A) through both surfaces. A battery 750 may be disposed between the first printed circuit board 730 and the second printed circuit board 740. The first connection member 710 and the second connection member 720 may electrically connect the first printed circuit board 730 and the second printed circuit board 740 across the battery 750.

Referring to FIG. 7, the first connection member 710 may be connected to a first surface 730A of the first printed circuit board 730, and the second connection member 720 may be connected to a second surface 730B of the first printed circuit board 730. In addition, the first connection member 710 may be connected to a first surface 740A of the second printed circuit board 740, and the second connection member 720 may be connected to a second surface 740B of the second printed circuit board 740.

A connector 711 installed at one end of the first connection member 710 may be connected to a first connector 731 disposed on the first surface 730A of the first printed circuit board 730, and a connector 712 installed at the other end may be connected to a second connector 741 disposed on the first surface 740A of the second printed circuit board 740. A connector 721 installed at one end of the second connection member 720 may be connected to a third connector 732 disposed on the second surface 730B of the first printed circuit board 730, and a connector 722 installed at the other end may be connected to a fourth connector 742 disposed on the second surface 740B of the second printed circuit board 740.

Figure 8:
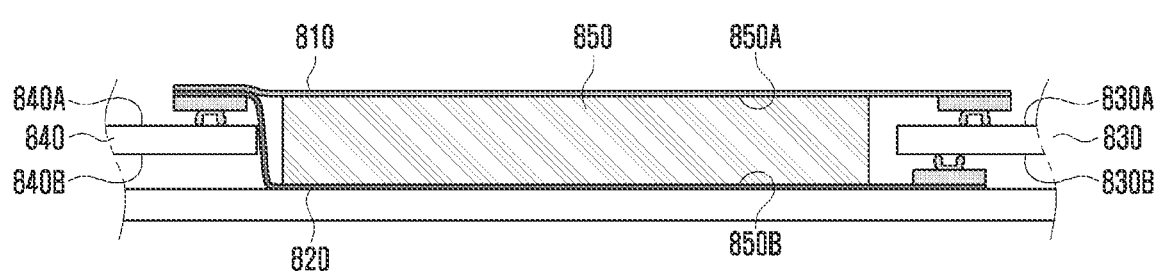
FIGS. 8 and 9 are views showing a simplified connection relationship between a first printed circuit board and a second printed circuit board included in an electronic device according to various embodiments of the disclosure.
Figure 9:
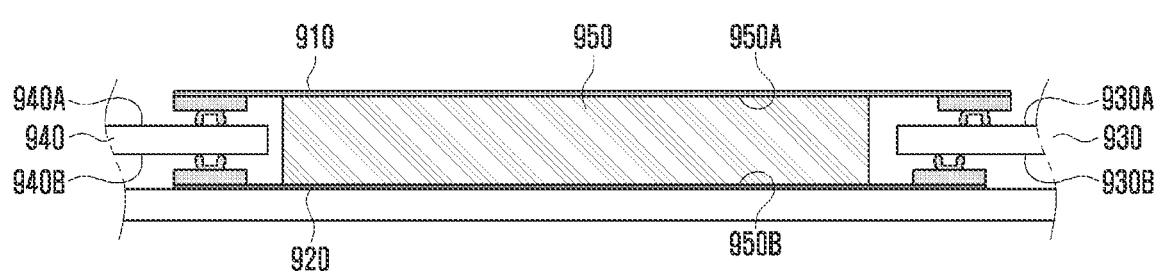

FIGS. 8 and 9 are views showing a simplified connection relationship between a first printed circuit board and a second printed circuit board included in an electronic device according to various embodiments of the disclosure.

Referring to FIGS. 8 and 9, unlike the first connection member or the second connection member described above, the first connection member and the second connection member may pass by two surfaces of the battery, respectively. For example, as shown in FIGS. 8 and 9, the first connection member 810 or 910 (e.g., first connection member 310 in FIG. 2A) may pass by the first surface 850A or 950A of the battery 850 or 950 (e.g., battery 400 in FIG. 2A), and the second connection member 820 or 920 (e.g., second connection member 320 in FIG. 2A) may pass by the second surface 850B or 950B of the battery 850 or 950 opposite to the first surface 850A or 950A.

Referring to FIG. 8, the first connection member 810 may be connected to the first surface 830A of the first printed circuit board 830 and the first surface 840A of the second printed circuit board 840 and may pass by the first surface 850A of the battery 850. The second connection member 820 may be connected to the second surface 830B of the first printed circuit board 830 and the first surface 840A of the second printed circuit board 840 and may pass by the second surface 850B of the battery 850.

Referring to FIG. 9, the first connection member 910 may be connected to the first surface 930A of the first printed circuit board 930 and the first surface 940A of the second printed circuit board 940, and may pass by the first surface 950A of the battery 950. The second connection member 920 may be connected to the second surface 930B of the first printed circuit board 930 and the second surface 940B of the second printed circuit board 940, and may pass by the second surface 950B of the battery 950.

Figure 10:
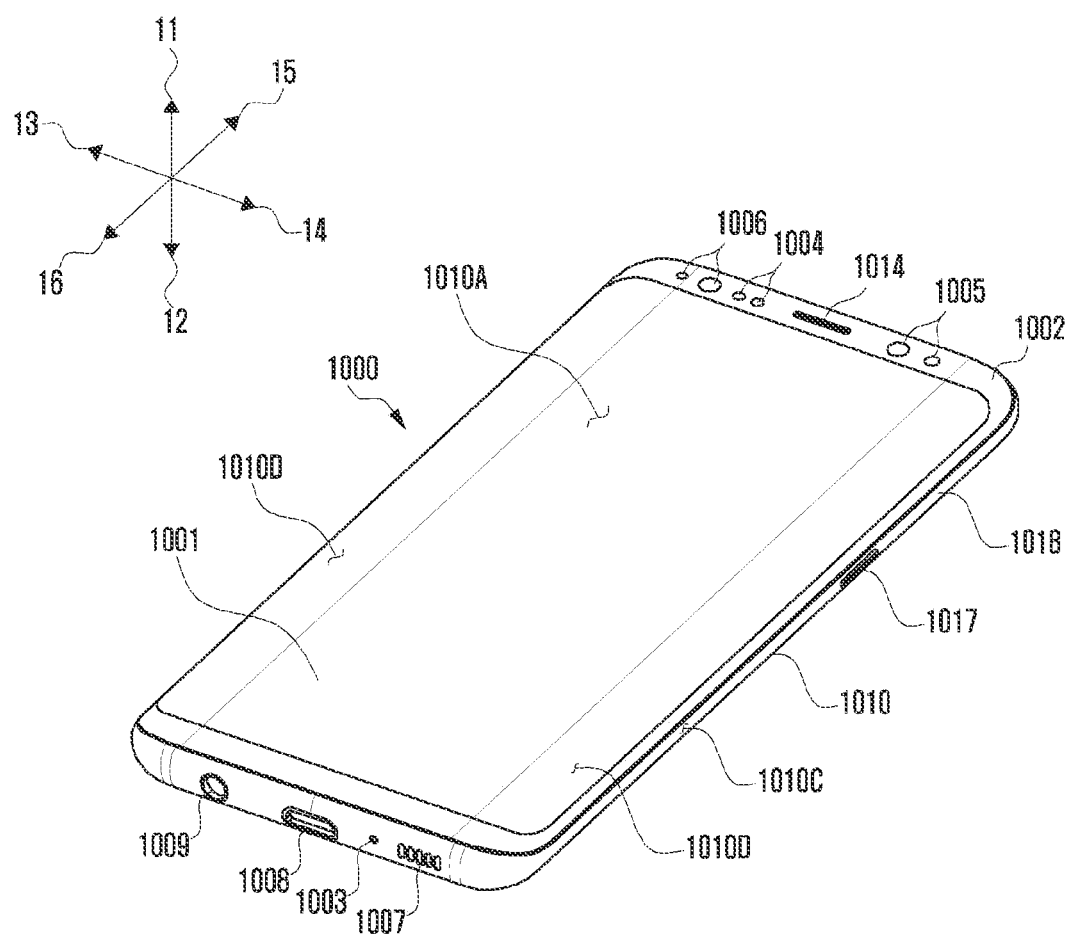
FIG. 10 is a front perspective view of a mobile electronic device according to an embodiment of the disclosure.
Figure 11:
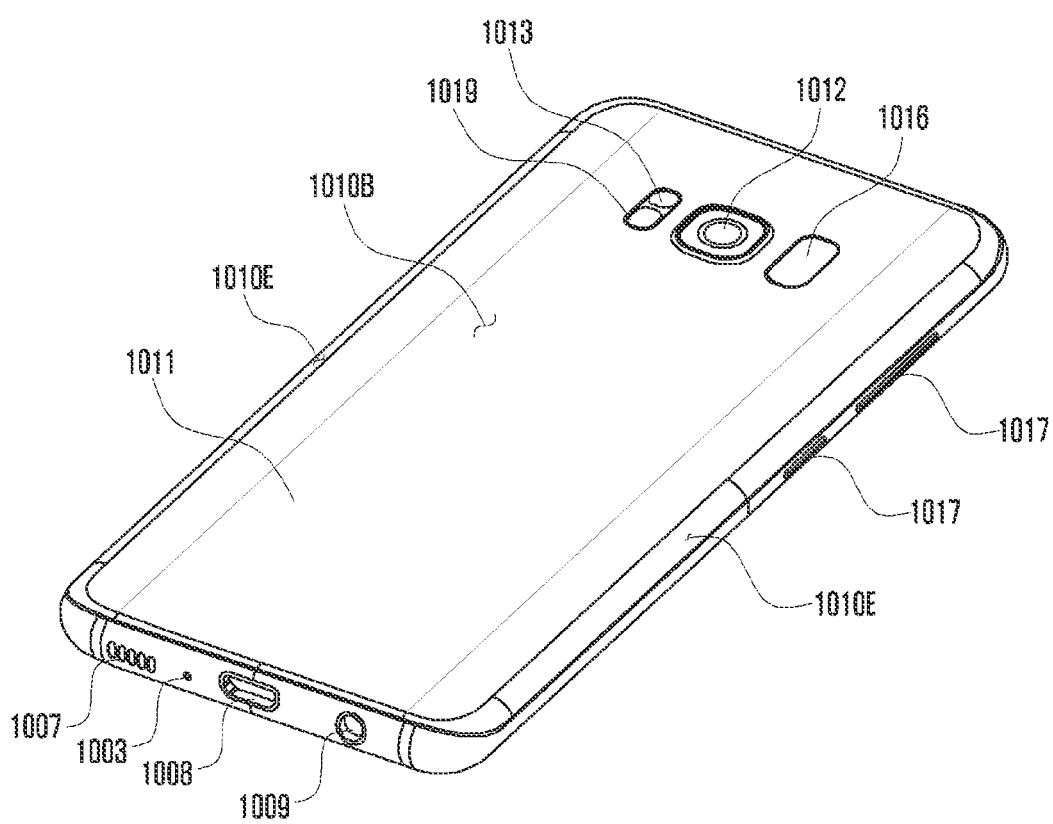
FIG. 11 is a rear perspective view of the electronic device shown in FIG. according to an embodiment of the disclosure.
Figure 12:
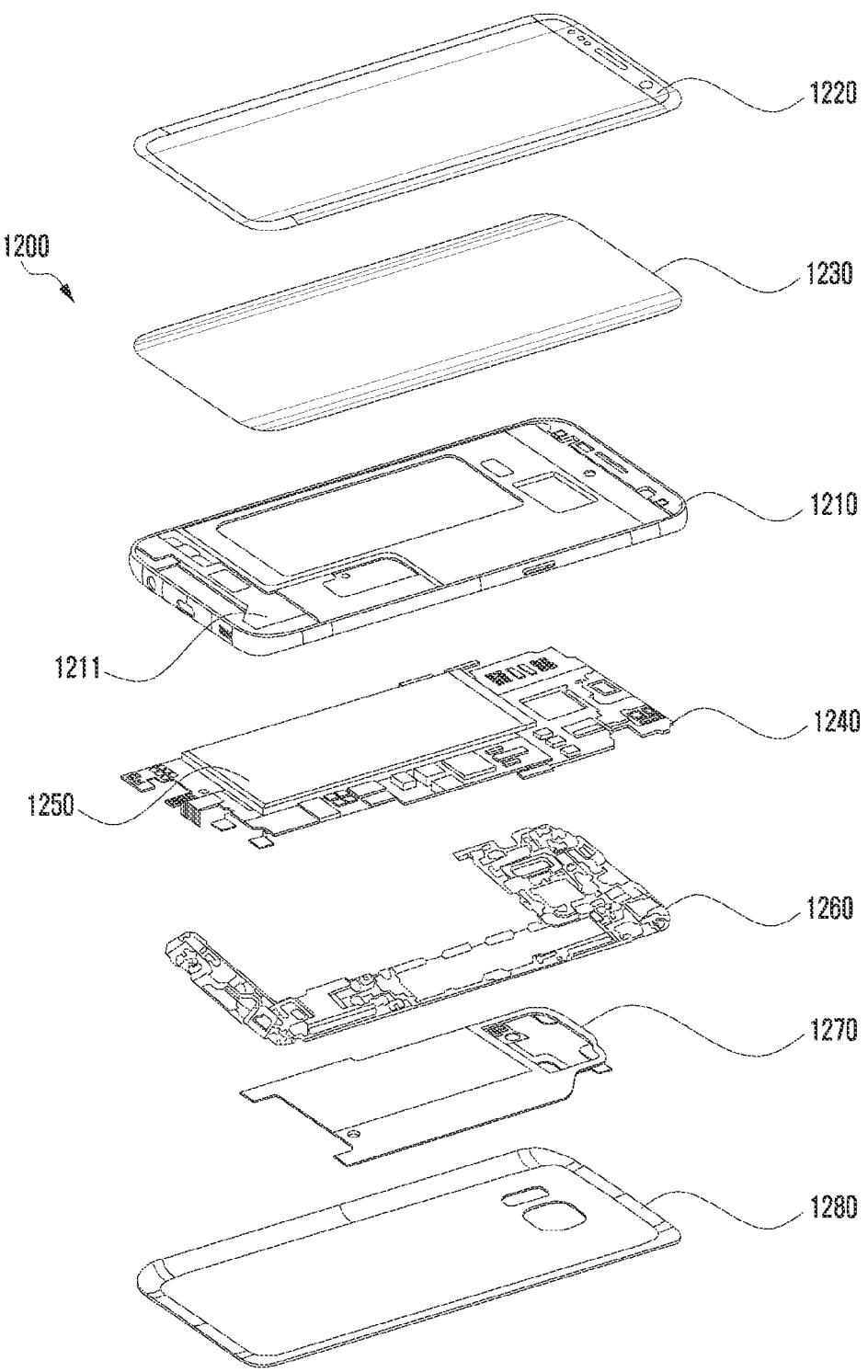
FIG. 12 is an exploded perspective view of the electronic device shown in FIG. 10 according to an embodiment of the disclosure.

The electronic device (e.g., electronic device 200 in FIG. 2A) may be, for example, the electronic device shown in FIGS. 10 to 12 according to various embodiment of the disclosure.

FIG. 10 is a front perspective view of a mobile electronic device according to an embodiment of the disclosure, FIG. 11 is a rear perspective view of the electronic device shown in FIG. 10 according to an embodiment of the disclosure, and FIG. 12 is an exploded perspective view of the electronic device shown in FIG. 10 according to an embodiment of the disclosure.

Referring to FIG. 10 and FIG. 11, an electronic device 1000 according to an embodiment may include a housing 1010 including a first surface (or front surface) 1010A, a second surface (or rear surface) 1010B, and a side surface 1010C surrounding the space between the first surface 1010A and the second surface 1010B. In another embodiment (not illustrated), the housing may denote a structure that forms a part of the first surface 1010A, the second surface 1010B, and the side surface 1010C illustrated in FIG. 10. According to an embodiment, the first surface 1010A may be formed by a front plate 1002, at least a part of which is substantially transparent (for example, a glass plate including various coating layers, or a polymer plate). The second surface 1010B may be formed by a rear plate 1011 that is substantially opaque. The rear plate 1011 may be made of coated or colored glass, ceramic, polymer, metal (for example, aluminum, stainless steel (STS), or magnesium), or a combination of at least two of the above-mentioned materials. The side surface 1010C may be formed by a side bezel structure (or "side member") 1018 which is coupled to the front plate 1002 and to the rear plate 1011, and which includes metal and/or polymer. In some embodiments, the rear plate 1011 and the side bezel structure 1018 may be formed integrally and may include the same material (for example, a metal material such as aluminum).

In the illustrated embodiment, the front plate 1002 may include two first areas 1010D on both ends of the long edge of the front plate 1002 such that the two first areas 1010D bend from the first surface 1010A toward the rear plate 1011 and extend seamlessly. In the illustrated embodiment (see FIG. 11), the rear plate 1011 may include two second areas 1010E on both ends of the long edge such that the two second areas 1010E bend from the second surface 1010B toward the front plate 1002 and extend seamlessly. In some embodiments, the front plate 1002 (or the rear plate 1011) may include only one of the first areas 1010D (or the second areas 1010E). In another embodiment, a part of the first areas 1010D or the second areas 1010E may not be included. In the above embodiments, when seen from the side surface of the electronic device 1000, the side bezel structure 1018 may have a first thickness (or width) on a part of the side surface, which does not include the first areas 1010D or the second areas 1010E as described above, and may have a second thickness that is smaller than the first thickness on a part of the side surface, which includes the first areas 1010D or the second areas 1010E.

According to an embodiment, the electronic device 1000 may include at least one of a display 1001, audio modules 1003, 1007, and 1014, sensor modules 1004, 1016, and 1019, camera modules 1005, 1012, and 1013, a key input device 1017, a light-emitting element 1006, and connector holes 1008 and 1009. In some embodiments, at least one of the constituent elements (for example, the key input device 1017 or the light-emitting element 1006) of the electronic device 1000 may be omitted, or the electronic device 1000 may additionally include another constituent element.

The display 1001 may be exposed through a corresponding part of the front plate 1002, for example. In some embodiments, at least a part of the display 1001 may be exposed through the front plate 1002 that forms the first areas 1010D of the side surface 1010C and the first surface 1010A. In some embodiments, the display 1001 may have a corner formed in substantially the same shape as that of the adjacent outer periphery of the front plate 1002. In another embodiment (not illustrated), in order to increase the area of exposure of the display 1001, the interval between the outer periphery of the display 1001 and the outer periphery of the front plate 1002 may be formed to be substantially identical.

In another embodiment (not illustrated), a recess or an opening may be formed in a part of the screen display area of the display 1001, and at least one of an audio module 1014, a sensor module 1004, a camera module 1005, and a light-emitting element 1006 may be included and aligned with the recess or the opening. In another embodiment (not illustrated), on the back surface of the screen display area of the display 1001, at least one of an audio module 1014, a sensor module 1004, a camera module 1005, a fingerprint sensor 1016, and a light-emitting element 1006 may be included. In another embodiment (not illustrated), the display 1001 may be coupled to or arranged adjacent to a touch sensing circuit, a pressure sensor capable of measuring the intensity (pressure) of a touch, and/or a digitizer that detects a magnetic field-type stylus pen. In some embodiments, at least a part of the sensor modules 1004 and 1019 and/or at least a part of the key input device 1017 may be arranged in the first areas 1010D and/or the second areas 1010E.

The audio modules 1003, 1007, and 1014 may include a microphone hole 1003 and speaker holes 1007 and 1014. A microphone for acquiring an external sound may be arranged in the microphone hole 1003, and a plurality of microphones may be arranged therein such that the direction of a sound can be sensed in some embodiments. The speaker holes 1007 and 1014 may include an outer speaker hole 1007 and a speech receiver hole 1014. In some embodiments, the speaker holes 1007 and 1014 and the microphone hole 1003 may be implemented as a single hole, or a speaker may be included (for example, a piezoelectric speaker) without the speaker holes 1007 and 1014.

The sensor modules 1004, 1016, and 1019 may generate an electric signal or a data value corresponding to the internal operating condition of the electronic device 1000 or the external environment condition thereof. The sensor modules 1004, 1016, and 1019 may include, for example, a first sensor module 1004 (for example, a proximity sensor) arranged on the first surface 1010A of the housing 1010, and/or a second sensor module (not illustrated) (for example, a fingerprint sensor), and/or a third sensor module 1019 (for example, an HRM sensor) arranged on the second surface 1010B of the housing 1010, and/or a fourth sensor module 1016 (for example, a fingerprint sensor). The fingerprint sensor may be arranged not only on the first surface 1010A (for example, the display 1001) of the housing 1010, but also on the second surface 1010B thereof. The electronic device 1000 may further include a sensor module not illustrated, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or a luminance sensor 1004.

The camera modules 1005, 1012, and 1013 may include a first camera device 1005 arranged on the first surface 1010A of the electronic device 1000, a second camera device 1012 arranged on the second surface 1010B thereof, and/or a flash 1013. The camera devices 1005 and 1012 may include a single lens or a plurality of lenses, an image sensor, and/or an image signal processor. The flash 1013 may include, for example, a light-emitting diode or a xenon lamp. In some embodiments, two or more lenses (an infrared camera, a wide-angle lens, and a telephoto lens) and image sensors may be arranged on a single surface of the electronic device 1000.

The key input device 1017 may be arranged on the side surface 1010C of the housing 1010. In another embodiment, the electronic device 1000 may not include a part of the above-mentioned key input device 1017 or the entire key input device 1017, and the key input device 1017 (not included) may be implemented in another type, such as a soft key, on the display 1001. In some embodiments, the key input device may include a sensor module 1016 arranged on the second surface 1010B of the housing 1010.

The light-emitting element 1006 may be arranged on the first surface 1010A of the housing 1010, for example. The light-emitting element 1006 may provide information regarding the condition of the electronic device 1000 in a light type, for example. In another embodiment, the light-emitting element 1006 may provide a light source that interworks with operation of the camera module 1005, for example. The light-emitting element 1006 may include, for example, an LED, an IR LED, and a xenon lamp.

The connector holes 1008 and 1009 may include a first connector hole 1008 capable of containing a connector (for example, a USB connector) for transmitting/receiving power and/or data to/from an external electronic device, and/or a second connector hole (for example, an earphone jack) 1009 capable of containing a connector for transmitting/receiving an audio signal to/from the external electronic device.

Referring to FIG. 12, the electronic device 1200 may include a side bezel structure 1210, a first support member 1211 (for example, a bracket), a front plate 1220, a display 1230, a printed circuit board 1240, a battery 1250, a second support member 1260 (for example, a rear case), an antenna 1270, and a rear plate 1280. In some embodiments, at least one of the constituent elements (for example, the first support member 1211 or the second support member 1260) of the electronic device 1200 may be omitted, or the electronic device 1200 may further include another constituent element. At least one of the constituent elements of the electronic device 1200 may be identical or similar to at least one of the constituent elements of the electronic device 1000 of FIG. 10 or FIG. 11, and repeated descriptions thereof will be omitted herein.

The first support member 1211 may be arranged inside the electronic device 1200 and connected to the side bezel structure 1210, or may be formed integrally with the side bezel structure 1210. The first support member 1211 may be made of a metal material and/or a nonmetal (for example, polymer) material, for example. The display 1230 may be coupled to one surface of the first support member 1211, and the printed circuit board 1240 may be coupled to the other surface thereof. A processor, a memory, and/or an interface may be mounted on the printed circuit board 1240. The processor may include, for example, one or more of a central processing device, an application processor, a graphic processing device, an image signal processor, an sensor hub processor, or a communication processor.

The memory may include a volatile memory or a non-volatile memory, for example.

The interface may include, for example, a high definition multimedia interface (HDMI), a universal serial bus (USB) interface, an SD card interface, and/or an audio interface. The interface may connect the electronic device 1200 with an external electronic device electrically or physically, for example, and may include a USB connector, an SD card/MMC connector, or an audio connector.

The battery 1250 is a device for supplying power to at least one constituent element of the electronic device 1200, and may include a non-rechargeable primary cell, a rechargeable secondary cell, or a fuel cell, for example. At least a part of the battery 1250 may be arranged on substantially the same plane with the printed circuit board 1240, for example. The battery 1250 may be arranged integrally inside the electronic device 1200, or may be arranged such that the same can be attached to/detached from the electronic device 1200.

The antenna 1270 may be arranged between the rear plate 1280 and the battery 1250. The antenna 1270 may include, for example, a near field communication (NFC) antenna, a wireless charging antenna, and/or a magnetic secure transmission (MST) antenna. The antenna 1270 may conduct near-field communication with an external device or may wirelessly transmit/receive power necessary for charging, for example. In another embodiment, an antenna structure may be formed by a part or a combination of the side bezel structure 1210 and/or the first support member 1211.

According to various embodiments of the disclosure, an electronic device may include a first printed circuit board having a first surface and a second surface opposite to the first surface; a second printed circuit board having a first surface and a second surface opposite to the first surface and disposed to be spaced apart from the first printed circuit board; a battery disposed between the first printed circuit board and the second printed circuit board; a first connection member that is connected to the first surface of the first printed circuit board and is connected to one of the first surface and the second surface of the second printed circuit board to thereby electrically connect the first printed circuit board and the second printed circuit board; and a second connection member that is connected to the second surface of the first printed circuit board and is connected to one of the first surface and the second surface of the second printed circuit board to thereby electrically connect the first printed circuit board and the second printed circuit board, wherein the first connection member and the second connection member may be arranged to at least partially overlap at a portion passing by the battery.

In addition, the first connection member may be connected to a first connector disposed on the first surface of the first printed circuit board and a second connector disposed on at least one of the first surface or the second surface of the second printed circuit board, and the second connection member may be connected to a third connector disposed on the second surface of the first printed circuit board and the second connector of the second printed circuit board.

In addition, the first connection member may be connected to a first connector disposed on the first surface of the first printed circuit board and a second connector disposed on at least one of the first surface or the second surface of the second printed circuit board, and the second connection member may be connected to a third connector disposed on the second surface of the first printed circuit board and a fourth connector disposed on at least one of the first surface or the second surface of the second printed circuit board.

In addition, the first connection member and the second connection member may further include a reinforcing tape attached to at least some region.

In addition, the electronic device may further include a shielding member disposed between the first connection member and the second connection member.

In addition, the electronic device may further include a sheet member including at least one of a heat diffusion sheet disposed to cover the battery or a noise shielding sheet.

In addition, a portion of the sheet member in contact with the first connection member and the second connection member may be formed to be thinner than the remaining portions.

In addition, the electronic device may further include a plate on which the first printed circuit board, the second printed circuit board, and the battery are disposed, and the plate may include a seating portion formed to be concave in at least some region facing the second surface of the first printed circuit board.

In addition, the connector of the second connection member connected to the second surface of the first printed circuit board may be formed to extend in the extending direction of the first printed circuit board so as to increase the contact area with the seating portion.

In addition, the electronic device may further include a buffer member disposed between the connector of the second connection member connected to the second surface of the first printed circuit board and the first printed circuit board.

In addition, the plate may further include an insertion groove formed in the seating portion, and at least a portion of the connector of the second connection member connected to the second surface of the first printed circuit board may be inserted into the insertion groove of the plate.

According to various embodiments of the present disclosure, an electronic device may include a first printed circuit board having a first surface and a second surface opposite to the first surface; a second printed circuit board having a first surface and a second surface opposite to the first surface and disposed to be spaced apart from the first printed circuit board; a battery having a first surface and a second surface opposite to the first surface and disposed between the first printed circuit board and the second printed circuit board; a first connection member that is connected to the first surface of the first printed circuit board and is connected to one of the first surface and the second surface of the second printed circuit board to thereby electrically connect the first printed circuit board and the second printed circuit board; and a second connection member that is connected to the second surface of the first printed circuit board and is connected to one of the first surface and the second surface of the second printed circuit board to thereby electrically connect the first printed circuit board and the second printed circuit board, wherein the first connection member may pass by the first surface of the battery, and the second connection member may pass by the second surface of the battery.

In addition, the first connection member may be connected to a first connector disposed on the first surface of the first printed circuit board and a second connector disposed on at least one of the first surface or the second surface of the second printed circuit board, and the second connection member may be connected to a third connector disposed on the second surface of the first printed circuit board and the second connector of the second printed circuit board.

In addition, the first connection member may be connected to a first connector disposed on the first surface of the first printed circuit board and a second connector disposed on at least one of the first surface or the second surface of the second printed circuit board, and the second connection member may be connected to a third connector disposed on the second surface of the first printed circuit board and a fourth connector disposed on at least one of the first surface or the second surface of the second printed circuit board.

In addition, the first connection member and the second connection member may further include a reinforcing tape attached to at least some region.

In addition, the electronic device may further include a sheet member including at least one of a heat diffusion sheet disposed to cover the battery or a noise shielding sheet.

In addition, the electronic device may further include a plate on which the first printed circuit board, the second printed circuit board, and the battery are disposed, and the plate may include a seating portion formed to be concave in at least some region facing the second surface of the first printed circuit board.

In addition, the connector of the second connection member connected to the second surface of the first printed circuit board may be formed to extend in the extending direction of the first printed circuit board so as to increase the contact area with the seating portion.

In addition, the plate may further include an insertion groove formed in the seating portion, and at least a portion of the connector of the second connection member connected to the second surface of the first printed circuit board may be inserted into the insertion groove of the plate.

In addition, the electronic device may further include a buffer member disposed between the connector of the second connection member connected to the second surface of the first printed circuit board and the first printed circuit board.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a printed circuit board, PCB, including a first connector disposed on a first surface of the PCB to be connected with a first flexible printed circuit board and a second connector disposed on a second surface of the PCB opposite to the first surface to be connected with a second flexible printed circuit board;
   the first flexible printed circuit board, FPCB, extending in a direction such that the first FPCB is connected between the printed circuit board and one or more additional printed circuit boards using at least the first connector; and
   the second flexible printed circuit board, FPCB, extending in a direction such that the second FPCB is connected between the printed circuit board and one or more additional printed circuit boards using at least the second connector,
   wherein the first connector and the second connector are arranged to at least partially overlap in view from above the printed circuit board.

2. The electronic device of claim 1, further comprising a battery having a first surface and a second surface opposite to the first surface,
   wherein the first FPCB and the second FPCB are extended across the battery.

3. The electronic device of claim 2,
   wherein the first FPCB and the second FPCB are arranged to at least partially overlap at a portion passing by the battery.

4. The electronic device of claim 2,
   wherein the first FPCB passes by the first surface of the battery, and
   wherein the second FPCB passes by the second surface of the battery.

5. The electronic device of claim 1, further comprising:
   a first reinforcing tape attached to the first FPCB; and
   a second reinforcing tape attached to the second FPCB.

6. The electronic device of claim 5,
   wherein the first reinforcing tape is attached to a portion where the first FPCB is bent, and
   wherein the second reinforcing tape is attached to a portion where the second FPCB is bent.

7. The electronic device of claim 1, further comprising a shielding layer disposed between the first FPCB and the second FPCB.

8. The electronic device of claim 7,
   wherein the shielding layer is disposed at a portion where the first FPCB and the second FPCB at least partially overlap.

9. The electronic device of claim 7, further comprising an additional shielding layer disposed on an upper surface of the first FPCB.

10. The electronic device of claim 1,
    wherein the first FPCB and the second FPCB are connected between the PCB and a specific additional printed circuit board using at least the first connector and the second connector respectively.

11. The electronic device of claim 10,
    wherein the specific additional printed circuit board includes a third connector disposed on a first surface of the specific additional printed circuit board to be connected with the first FPCB and a fourth connector disposed on the first surface of the specific additional printed circuit board to be connected with the second FPCB.

12. The electronic device of claim 10,
    wherein the specific additional printed circuit board includes a third connector disposed on a first surface of the specific additional printed circuit board, and
    wherein the first FPCB and the second FPCB are connected to the third connector.

13. The electronic device of claim 10,
    wherein the specific additional printed circuit board includes a third connector disposed on a first surface of the specific additional printed circuit board to be connected with the first FPCB and a fourth connector disposed on a second surface opposite to the first surface of the specific additional printed circuit board to be connected with the second FPCB.

14. The electronic device of claim 1,
    wherein a connector of the second FPCB connected to the second surface of the PCB is formed to extend longer in an extending direction of the PCB in comparison to a connector of the first FPCB connected to the first surface of the PCB.

15. The electronic device of claim 1, further comprising a plate on which the PCB and the additional printed circuit boards are disposed,
   wherein the plate includes a seating portion formed to be concave in at least some region facing the second surface of the PCB.

16. The electronic device of claim 15, further comprising a buffer member disposed between a connector of the second FPCB connected to the second surface of the PCB and the PCB.

17. The electronic device of claim 15,
   wherein the plate further includes an insertion groove formed in the seating portion, and
   wherein at least a portion of the connector of the second FPCB connected to the second surface of the PCB is inserted into the insertion groove of the plate.

18. The electronic device of claim 3, further comprising a sheet member including at least one of a heat diffusion sheet disposed to cover the battery or a noise shielding sheet.

19. The electronic device of claim 18,
   wherein a portion of the sheet member in contact with the first FPCB and the second FPCB is formed to be thinner than remaining portions of the sheet member.

20. The electronic device of claim 18,
   wherein the sheet member is disposed in a portion spaced apart from the first FPCB and the second FPCB.

\* \* \* \* \*